United States Patent
Landeros et al.

(10) Patent No.: US 7,359,211 B2
(45) Date of Patent: Apr. 15, 2008

(54) LOCAL CONTROL OF UNDERFILL FLOW ON HIGH DENSITY PACKAGES, PACKAGES AND SYSTEMS MADE THEREWITH, AND METHODS OF MAKING SAME

(75) Inventors: Juan Landeros, Gilbert, AZ (US); Jason Zhang, Gilbert, AZ (US); Lejun Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 10/791,048

(22) Filed: Mar. 2, 2004

(65) Prior Publication Data
US 2005/0195582 A1   Sep. 8, 2005

(51) Int. Cl.
*H05K 7/00* (2006.01)
(52) U.S. Cl. .............. 361/760; 361/783; 361/782
(58) Field of Classification Search ........... 361/760, 361/783, 782
See application file for complete search history.

(56) References Cited

U.S. PATENT DOCUMENTS

| | | | | |
|---|---|---|---|---|
| 5,218,234 A | * | 6/1993 | Thompson et al. | 257/787 |
| 6,048,656 A | * | 4/2000 | Akram et al. | 430/118 |
| 6,291,264 B1 | * | 9/2001 | Tang et al. | 438/106 |
| 6,356,453 B1 | * | 3/2002 | Juskey et al. | 361/760 |
| 2003/0070835 A1 | * | 4/2003 | Maa et al. | |
| 2004/0032706 A1 | * | 2/2004 | Kemmochi et al. | |
| 2004/0118599 A1 | * | 6/2004 | Chason et al. | |

* cited by examiner

*Primary Examiner*—Tuan T. Dinh
*Assistant Examiner*—Yuriy Semenenko
(74) *Attorney, Agent, or Firm*—Blakely, Sokoloff, Taylor & Zafman LLP (57) ABSTRACT

An article includes a mounting substrate, a passive component site on the mounting substrate, and an active component site on the mounting substrate. The article also includes a fluid flow barrier disposed local to the passive component site and spaced apart from the active component site. The fluid flow barrier can be a recess that resists fluid flow thereinto because of surface tension of the fluid when it meets the recess edge. The fluid flow barrier can include a boundary that diverts fluid flow due to the angle of the recess edge as the fluid approaches it. An embodiment also includes a packaging system that includes the article and at least one passive component. An embodiment also includes a method of assembling the article or the packaging system.

28 Claims, 7 Drawing Sheets

LOCAL CONTROL OF UNDERFILL FLOW ON HIGH DENSITY PACKAGES, PACKAGES AND SYSTEMS MADE THEREWITH, AND METHODS OF MAKING SAME

TECHNICAL FIELD

Embodiments relate to a packaged semiconductive die with integrated circuitry. More particularly, an embodiment relates to an underfill material flow barrier that is local to a passive component.

BACKGROUND INFORMATION

The thermal stability of packaging compositions such as underfill materials or other organic encapsulation molding compounds, is important in reducing the warpage of chip packages. Desirable materials have properties such as high thermal stability, low shrinkage, a favorable coefficient of thermal expansion (CTE), and other qualities such as a low moisture uptake.

In chip packaging technology, the die is often bond-strengthened to the mounting substrate with an organic material that is flowed into contact with the die and the mounting substrate. In flip-chip processing, the organic material flows between the die active surface and the mounting substrate, thus strengthening the bond therebetween, while protecting the electrical contacts.

Some of the organic material invariably flows beyond the footprint of the die and onto the mounting substrate at the margins of the die. The extent of this organic material flow, restricts the proximity of electrical contacts for passive components that are to be placed near the die, because the organic material can foul their contacts.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting in scope, the embodiments will be described and explained with additional specificity and detail through the use of the accompanying drawings in which.

DETAILED DESCRIPTION

The following description includes terms, such as "upper", "lower", "first", "second", etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. The term "chip" as used herein refers to a die that has been encapsulated in an organic, an inorganic, or a combination organic and inorganic housing. A "board" is typically a resin-impregnated fiberglass structure that acts as a mounting substrate for the chip.

Figure 1:
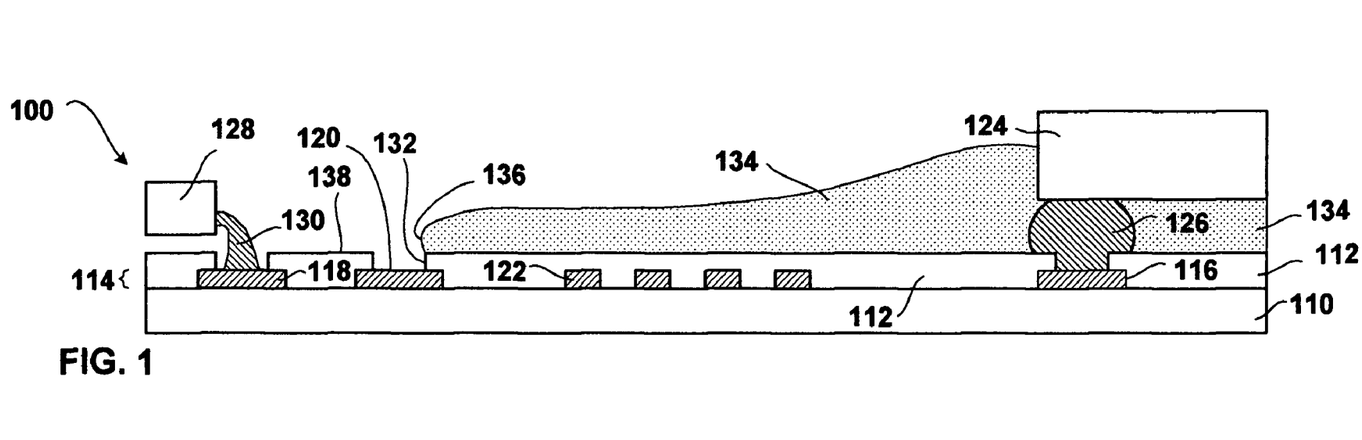
FIG. 1 is a cross-section of a package that includes a fluid flow barrier on a microstrip mounting substrate according to an embodiment.

FIG. 1 is a cross-section of a package 100 that includes a fluid flow barrier on a microstrip mounting substrate according to an embodiment. A mounting substrate 110 for a microstrip board includes a solder mask 112 that covers an electrical layer 114. In an embodiment, the electrical layer 114 includes a copper layer that has been patterned to include an active component bond pad 116. The electrical layer 114 can also include a passive component bond pad 118. The electrical layer 114 can also include exposed conductive material that acts as a floor 120 in a fluid flow barrier according to an embodiment. Additionally, the electrical layer 114 can include traces 122, one of which is indicated in FIG. 1.

In an embodiment for a chip package, an active component 124, such as a processor or a memory chip, is bonded to the active component bond pad 116 through a bump 126 according to an embodiment. The bump 126 is depicted as a solder ball, but other electrical connections can be used according to the specific application. Other electrical connections include bond wires bonded to the active component bond pad 116, lead fingers, pins, and others. According to an embodiment, a fluid flow barrier 132 is coupled to the active component 124 by virtue of its physical disposition in relation thereto.

In an embodiment for a chip package, a passive component 128, such as a capacitor, an inductor, a resistor, or another passive component, is bonded to the passive component bond pad 118 through a bump 130 according to an embodiment. The bump 130 is depicted as a lead finger, but other electrical connections can be used according to the specific application. Other electrical connections include bond wires bonded to the passive component bond pad 118, solder balls, pins, and others. Similarly, according to an embodiment, the fluid flow barrier 132 is coupled to the passive component 128 by virtue of its physical disposition in relation thereto.

FIG. 1 also depicts a fluid flow barrier 132, depicted in FIG. 1 as a recess 132 in the solder mask 112. The fluid flow barrier 132 can also be a dam according to an embodiment. The fluid flow barrier 132 can also be a recess in dam according to an embodiment. In any event, the fluid flow barrier 132 is disposed local to the passive component 128, and consequently local to the passive component site as set forth in this disclosure. The floor 120 can be the dielectric of the mounting substrate 110, however, if no electrical layer 114 is present in the recess 132.

FIG. 1 also depicts an underfill material 134 that is illustrated as having filled the space between the active component 124 and the mounting substrate 110 to insulate and protect the bump 126. FIG. 1 also depicts incidental flow of the underfill material 134 beyond the margins of the active component 124, across the solder mask 112, and stopping at or near the edge of the fluid flow barrier 132. By "underfill material", it is understood that an encapsulation material such as a polymer is used. The application of a flowable encapsulation material is not intended to be restricted to the underfill process. It is applicable to any process of applying an encapsulation material to a microelectronic device as it is being packaged with a local fluid flow barrier according to the various embodiments set forth in this disclosure.

In FIG. 1, the underfill material 134 is depicted as having formed a convex meniscus 136 at the lip that is formed in the solder mask 112 by the recess 132 that is the fluid flow barrier 132 embodiment depicted in FIG. 1. In an embodiment, surface tension in the underfill material 134 is such that as it encounters the fluid flow barrier 132, significant resistance to further flow occurs at the edge of the recess 132, sufficient for enough time for the underfill material 134 to cease flowing. Consequent to this embodiment, the fluid flow barrier 132 is integral with the solder mask 112.

FIG. 1 also depicts a raised portion 138 of the solder mask 112 that is between the fluid flow barrier 132 and the location of the passive component bond pad 118.

Although the floor 120 of the recess 132 is depicted as including an exposed portion of the electrical layer 114, it is understood that patterning of the electrical layer 114 can include a dielectric floor of the recess with only the substrate 110 exposed as the floor thereof.

Figure 2:
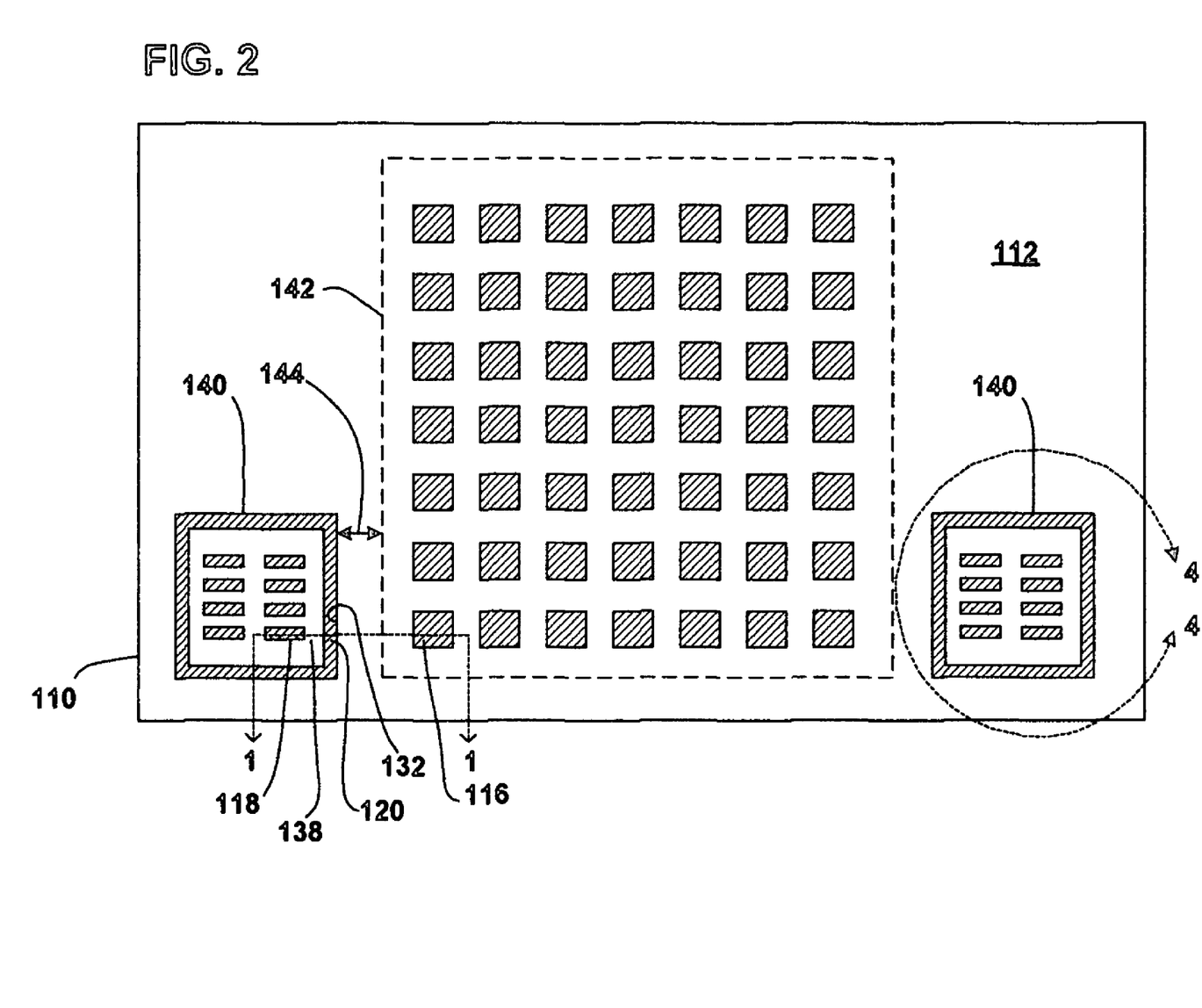
FIG. 2 is a selective plan view of the microstrip mounting substrate depicted in FIG. 1 according to an embodiment.

FIG. 2 is a selective plan view of the microstrip mounting substrate depicted in FIG. 1 according to an embodiment. The section line 1-1 illustrates the view taken from FIG. 1. The mounting substrate 112 includes a passive component site 140 and an active component site 142. The active component site 142 is depicted as an organic land grid array (OLGA) that includes a plurality of active component bond pads 116, one of which is labeled. The passive component site 140 is depicted as an OLGA that includes a plurality of passive component bond pads 118, one of which is labeled. The passive component site 140 is also depicted as a perimeter 140 around a given plurality of passive component bond pads 118 for a single passive component. The raised portion 138 of the solder mask 112 also delineates a perimeter around the plurality of passive component bond pads 118 for a single passive component. Accordingly in an embodiment, the fluid flow barrier for a given passive component site 140 is disposed local only to that passive component site 140.

FIG. 2 also depicts the spaced-apart distance between the perimeters of the passive component site 140 and the active component site 142. In an embodiment, the distance 144 between the perimeters of the passive component site 140 and the active component site 142 is in a range from about 5 millimeter (mm) to about 1 mm. In an embodiment, the distance 144 is in a range from about 1.5 mm to about 4 mm. In an embodiment, the distance 144 is in a range from about 2 mm to about 3 mm. In an embodiment, the distance 144 is about 1.7 mm.

Figure 3:
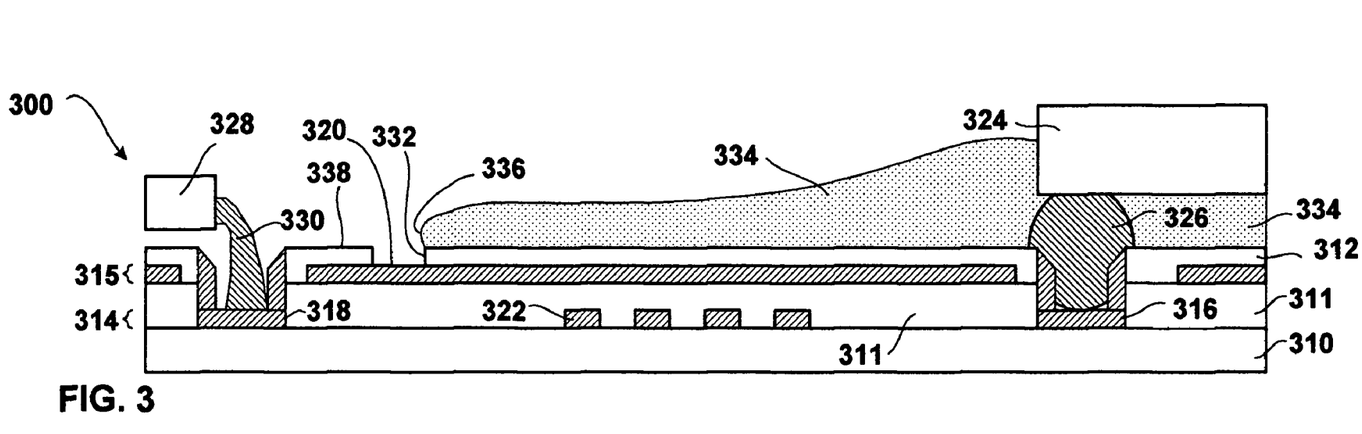
FIG. 3 is a cross-section of a package that includes a fluid flow barrier on a stripline mounting substrate according to an embodiment.

FIG. 3 is a cross-section of a package 300 that includes a fluid flow barrier on a stripline mounting substrate according to an embodiment. A mounting substrate 310 for a stripline board includes a substrate cover 311 that covers an electrical layer 314. In the stripline board, an electrical ground layer 315 is disposed above the electrical layer 314 and is exposed in selected sites with a solder mask 312. In an embodiment, the electrical layer 314 includes a copper layer that has been patterned to include an active component bond pad 316. The electrical layer 314 can also include a passive component bond pad 318. The electrical ground layer 315 can include exposed conductive material that acts as a floor 320 in a fluid flow barrier according to an embodiment. Additionally, the electrical layer 314 can include traces 322, one of which is indicated in FIG. 3.

In an embodiment for a chip package, an active component 324, such as a processor or a memory chip, is bonded to the active component bond pad 316 through a bump 326 according to an embodiment. The bump 326 is depicted as a solder ball, but other electrical connections can be used according to the specific application. Other electrical connections include bond wires bonded to the active component bond pad 316, lead fingers, pins, and others. According to an embodiment, the fluid flow barrier 332 is coupled to the active component 324 by virtue of its physical disposition in relation thereto.

The an embodiment for a chip package, a passive component 328, such as a capacitor, an inductor, a resistor, or another passive component, is bonded to the passive component bond pad 318 through a bump 330 according to an embodiment. The bump 330 is depicted as a lead finger, but other electrical connections can be used according to the specific application. Other electrical connections include bond wires bonded to the passive component bond pad 318, solder balls, pins, and others. Similarly, according to an embodiment, the fluid flow barrier 332 is coupled to the passive component 328 by virtue of its physical disposition in relation thereto.

FIG. 3 also depicts the fluid flow barrier 332, depicted in FIG. 3 as a recess 332 in the solder mask 312. The fluid flow barrier 332 can also be a dam according to an embodiment. The fluid flow barrier 332 can also be a recess in dam according to an embodiment. In any event, the fluid flow barrier 332 is disposed local to the passive component 328, and consequently local to the passive component site as set forth in this disclosure. An example of the local disposition of the fluid flow barrier 332 is set forth in FIG. 2 as item 132 and elsewhere in this disclosure.

FIG. 3 also depicts an underfill material 334 that is depicted as having filled the space between the active component 324 and the mounting substrate 310 to insulate and protect the bump 326. FIG. 3 also depicts incidental flow of the underfill material 334 beyond the margins of the active component 324, across the solder mask 312, and stopping at or near the edge of the fluid flow barrier 332. In FIG. 3, the underfill material 334 is depicted as having formed a convex meniscus 336 at the lip that is formed in the solder mask 312 by the recess 332 that is the fluid flow barrier 332 embodiment depicted in FIG. 3. In an embodiment, surface tension in the underfill material 334 is such that as it encounters the fluid flow barrier 332, significant resistance to further flow occurs at the edge of the recess 332, sufficient for enough time for the underfill material 334 to cease flowing. Consequent to this embodiment, the fluid flow barrier 332 is integral with the solder mask 312.

FIG. 3 also depicts a raised portion 338 of the solder mask 312 that is between the fluid flow barrier 332 and the location of the passive component bond pad 318.

Although the floor 320 of the recess 332 is depicted as including an exposed portion of the electrical ground layer 315, it is understood that patterning of the electrical ground layer 315 can include a floor of the recess 320 with only the substrate cover 311 exposed as the floor thereof.

Figure 4:
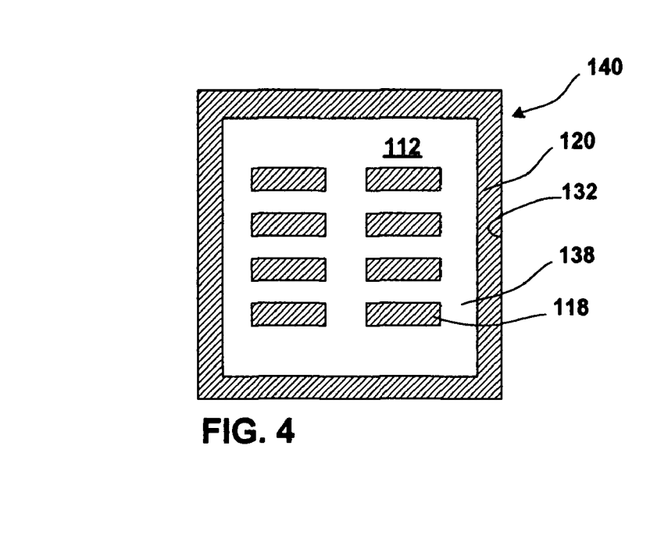
FIG. 4 is a plan of a passive component site detail taken from FIG. 3 according to an embodiment.

FIG. 4 is a plan of a passive component site 140 detail taken from FIG. 3, along the dashed line 4-4 according to an embodiment. The fluid flow barrier 132 is depicted at the perimeter with the floor 120 that in an embodiment is an exposed portion of the electrical layer 114. Consequently, the fluid flow barrier 132 is local to the passive component site 140. Additionally, the raised portion 138 of the solder mask 112 is depicted between the passive component bond pad 118 and the fluid flow barrier 132.

Figure 5:
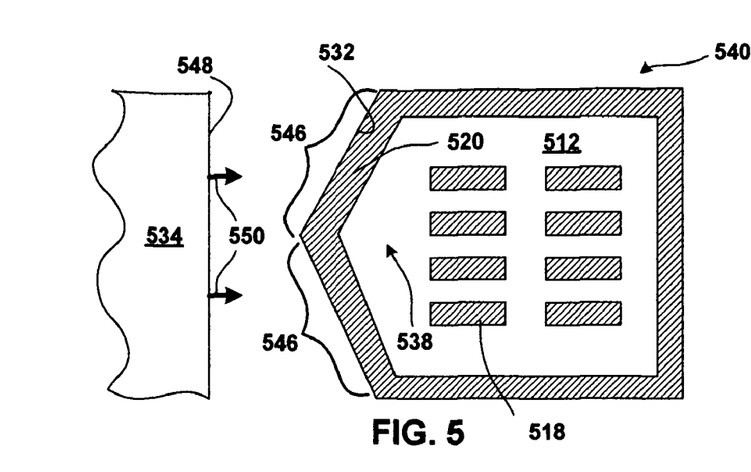
FIG. 5 is a plan of a passive component site according to an embodiment.

FIG. 5 is a plan of a passive component site 540 according to an embodiment. The passive component site 540 is similar in locatability to the passive component site 140 depicted in FIGS. 2 and 4. A fluid flow barrier 532 is depicted at the perimeter with a floor 520 that in an embodiment is an exposed portion of an electrical layer such as the electrical layer 114 depicted in FIG. 1. Consequently, the fluid flow barrier 532 is local to the passive component site 540. In an embodiment, the floor 520 exposes a substrate (not pictured). In an embodiment, the floor 520 exposes an electrical ground layer. Additionally, a raised portion 538 of the solder mask 512 is depicted between a passive component bond pad 518 and the fluid flow barrier 532.

FIG. 5 depicts a non-linear boundary 546 of the passive component site 540. The non-linear boundary 546 includes a boundary that is situated to divert flow of underfill material 534. Diversion of flow of underfill material 534 includes situating the non-linear boundary 546 such that a flow front 548 of underflow material 534 encounters the non-linear boundary 546 of the fluid flow barrier 532 at a non-orthogonal angle, as indicated by the directional arrows 550. In an embodiment, the non-linear boundary 546 is a composite of rectilinear segments 546.

In an embodiment, the non-linear boundary 546 includes two surfaces that are set at an obtuse but interior angle with respect to each other. In an embodiment, the angle is about 179°. In an embodiment, the angle is in a range from about 179° to about 150°. In an embodiment, the angle is in a range from about 150° to about 120°. In an embodiment, the angle is in a range from about 120° to about 91°. In an embodiment, the angle is an acute angle.

Figure 6:
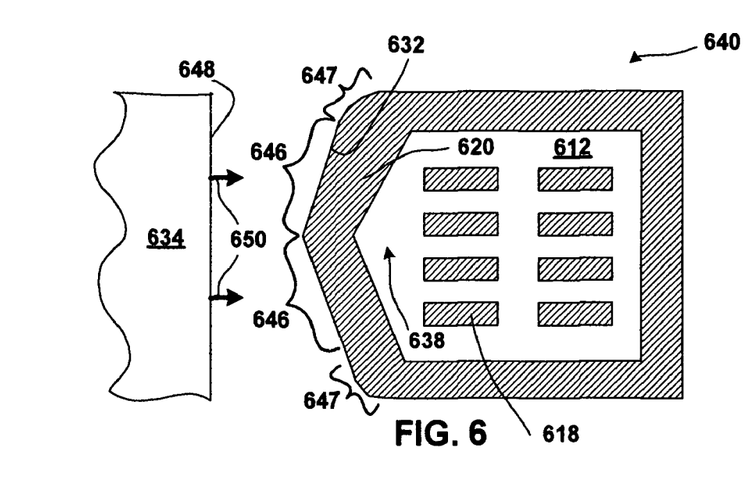
FIG. 6 is a plan of a passive component site according to an embodiment.

FIG. 6 is a plan of a passive component site 640 according to an embodiment. The passive component site 640 is similar in locatability to the passive component site 540 depicted in FIG. 5. A fluid flow barrier 632 is depicted at the perimeter with a floor 620 that in an embodiment is an exposed portion of an electrical layer such as the electrical layer 114 depicted in FIG. 1. Consequently, the fluid flow barrier 632 is local to the passive component site 640. In an embodiment, the floor 620 exposes a substrate (not pictured). In an embodiment, the floor 620 exposes an electrical ground layer. Additionally, a raised portion 638 of the solder mask 612 is depicted between a passive component bond pad 618 and the fluid flow barrier 632.

FIG. 6 depicts a non-linear boundary of the passive component site 640. The non-linear boundary includes a boundary that is situated to divert flow of underfill material 634. Diversion of flow of underfill material 634 includes situating the non-linear boundary such that a flow front 648 of underflow material 634 encounters the non-linear boundary of the fluid flow barrier 632 at a non-orthogonal angle, as indicated by the directional arrows 650. In an embodiment, the non-linear boundary is a composite of rectilinear segments 646 and curvilinear segments 647.

In an embodiment, the non-linear boundary includes two surfaces 646 that are set at an obtuse but interior angle with respect to each other. In an embodiment, the angle is about 179°. In an embodiment, the angle is in a range from about 179° to about 150°. In an embodiment, the angle is in a range from about 150° to about 120°. In an embodiment, the angle is in a range from about 120° to about 91°.

Figure 7:
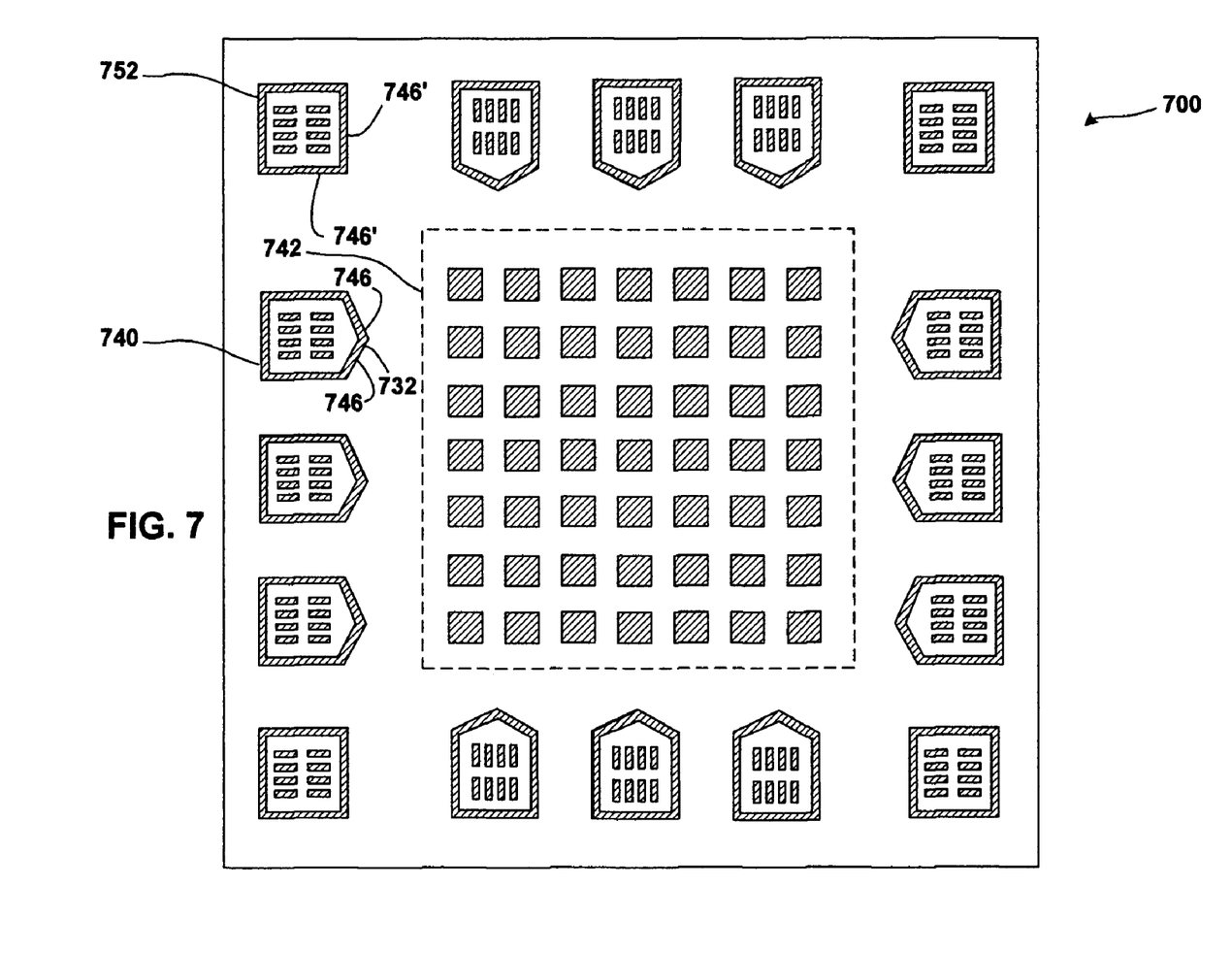
FIG. 7 is a plan of a mounting substrate that includes an active component site and a plurality of passive component sites according to an embodiment.

FIG. 7 is a plan of a mounting substrate 700 that includes an active component site 742 and a plurality of passive component sites according to an embodiment. Of the passive components sites, one is depicted with reference number 740. The passive component site 740 includes a fluid flow barrier 732 that is local thereto. In an embodiment, the passive component site 740 is depicted with a non-linear boundary 746 that faces the active component site 742. Accordingly, the non-linear boundary 746 is situated to divert flow of underfill material by a non-orthogonal encounter of the underfill material with a non-linear boundary 746 as set forth in this disclosure. In an embodiment, the mounting substrate 700 includes a corner passive component site 752 that is substantially rectangular with no actual non-linear boundaries. The corner passive component site 752, however, has effective non-linear boundaries as flow of underfill material will encounter the two closest boundaries 746' at a non-orthogonal flow angle relative thereto.

Figure 8:
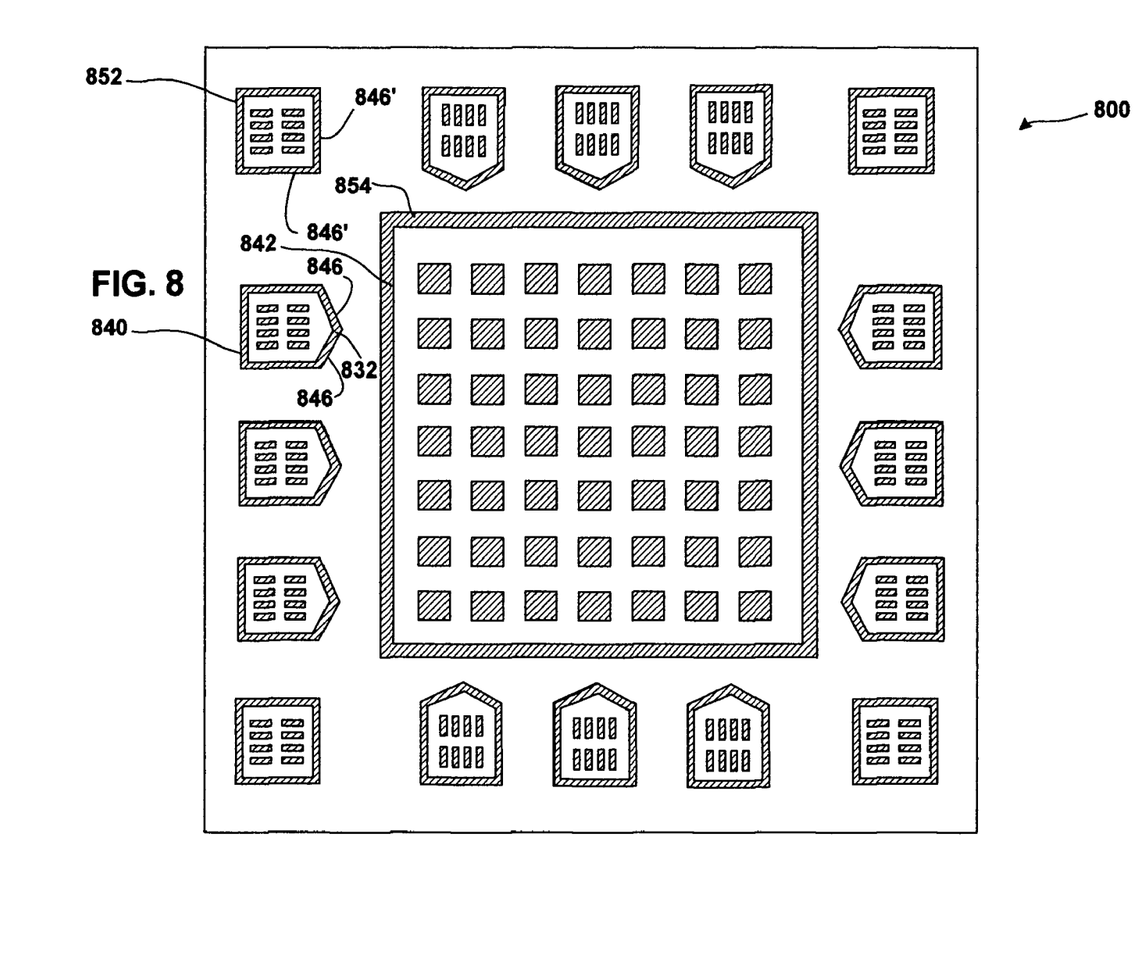
FIG. 8 is a plan of a mounting substrate that includes an active component site and a plurality of passive component sites according to an embodiment.

FIG. 8 is a plan of a mounting substrate 800 that includes an active component site 842 and a plurality of passive component sites according to an embodiment. Of the passive components sites, one is depicted with reference number 840. The passive component site 840 includes a fluid flow barrier 832 that is local thereto. In an embodiment, the passive component site 840 is depicted with a non-linear boundary 846 that faces the active component site 842. Accordingly, the non-linear boundary 846 is situated to divert flow of underfill material by a non-orthogonal encounter of the underfill material with a non-linear boundary 846 as set forth in this disclosure. In an embodiment, the mounting substrate 800 includes a corner passive component site 852 that is substantially rectangular with no actual non-linear boundaries. The corner passive component site 852, however, has effective non-linear boundaries as flow of underfill material will encounter the two closest boundaries 846' at a non-orthogonal flow angle relative thereto.

The mounting substrate 800 also includes a fluid flow barrier 854 that controls flow of underfill material generally. In an embodiment, the fluid flow barrier 854 is a recess such as the fluid flow barrier 132 depicted in FIG. 1. The fluid flow barrier 854 can also be a dam according to an embodiment. The fluid flow barrier 854 can also be a recess in dam according to an embodiment. In any event, the fluid flow barrier 854 is disposed generally with respect to the passive component sites 840.

Figure 9:
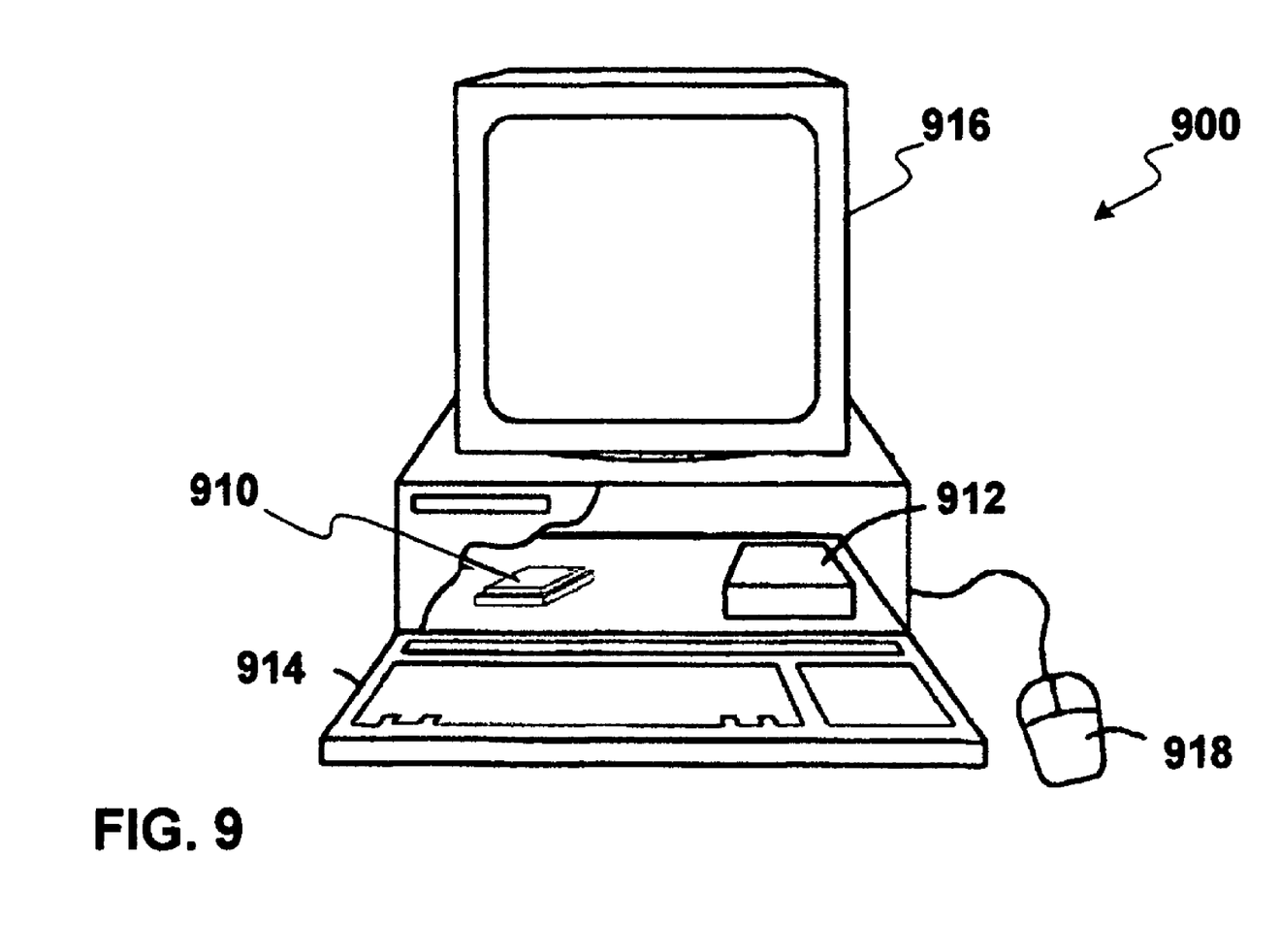
FIG. 9 is a perspective cut-away of a computing system that includes the packaging composition according to an embodiment.

FIG. 9 is a perspective cut-away of a computing system 900 that includes the local fluid flow barrier according to an embodiment. One or more of the foregoing embodiments of a structure that exhibits local control of underfill material during flow application may be utilized in a computing system, such as a computing system 900 of FIG. 9. The computing system 900 includes at least one processor (not pictured), which is enclosed in a package 910, a data storage system 912, at least one input device such as keyboard 914, and at least one output device such as monitor 916, for example. The computing system 900 includes a processor that processes data signals, and may include, for example, a microprocessor, available from Intel Corporation. In addition to the keyboard 914, the computing system 900 can include another user input device such as a mouse 918, for example.

For purposes of this disclosure, a computing system 900 embodying components in accordance with the claimed subject matter may include any system that utilizes a microelectronic device system, which may include, for example, a local fluid flow barrier that is coupled to data storage such as dynamic random access memory (DRAM), polymer memory, flash memory, and phase-change memory. In this embodiment, the local fluid flow barrier is coupled to any combination of these functionalities by being coupled to a processor. In an embodiment, however, a local fluid flow barrier set forth in this disclosure is coupled to any of these functionalities. For an example embodiment, data storage includes an embedded DRAM cache on a die. Additionally in an embodiment, the local fluid flow barrier that is coupled to the processor (not pictured) is part of the system with a local fluid flow barrier that is coupled to the data storage of the DRAM cache. Additionally in an embodiment, a local fluid flow barrier is coupled to the data storage 912.

In an embodiment, the computing system can also include a die that contains a digital signal processor (DSP), a micro controller, an application specific integrated circuit (ASIC), or a microprocessor. In this embodiment, the local fluid flow barrier is coupled to any combination of these functionalities by being coupled to a processor. For an example embodiment, a DSP (not pictured) is part of a chipset that may include a stand-alone processor (in package 910) and the DSP as separate parts of the chipset. In this embodiment, a local fluid flow barrier is coupled to the DSP, and a separate local fluid flow barrier may be present that is coupled to the processor in package 910. Additionally in an embodiment, a local fluid flow barrier is coupled to a DSP that is mounted on the same board as the package 910.

It can now be appreciated that embodiments set forth in this disclosure can be applied to devices and apparatuses other than a traditional computer. For example, a die can be packaged with an embodiment of the local fluid flow barrier, and placed in a portable device such as a wireless communicator or a hand-held device such as a personal data assistant and the like. Another example is a die that can be packaged with an embodiment of the local fluid flow barrier and placed in a vehicle such as an automobile, a locomotive, a watercraft, an aircraft, or a spacecraft.

Figure 10:
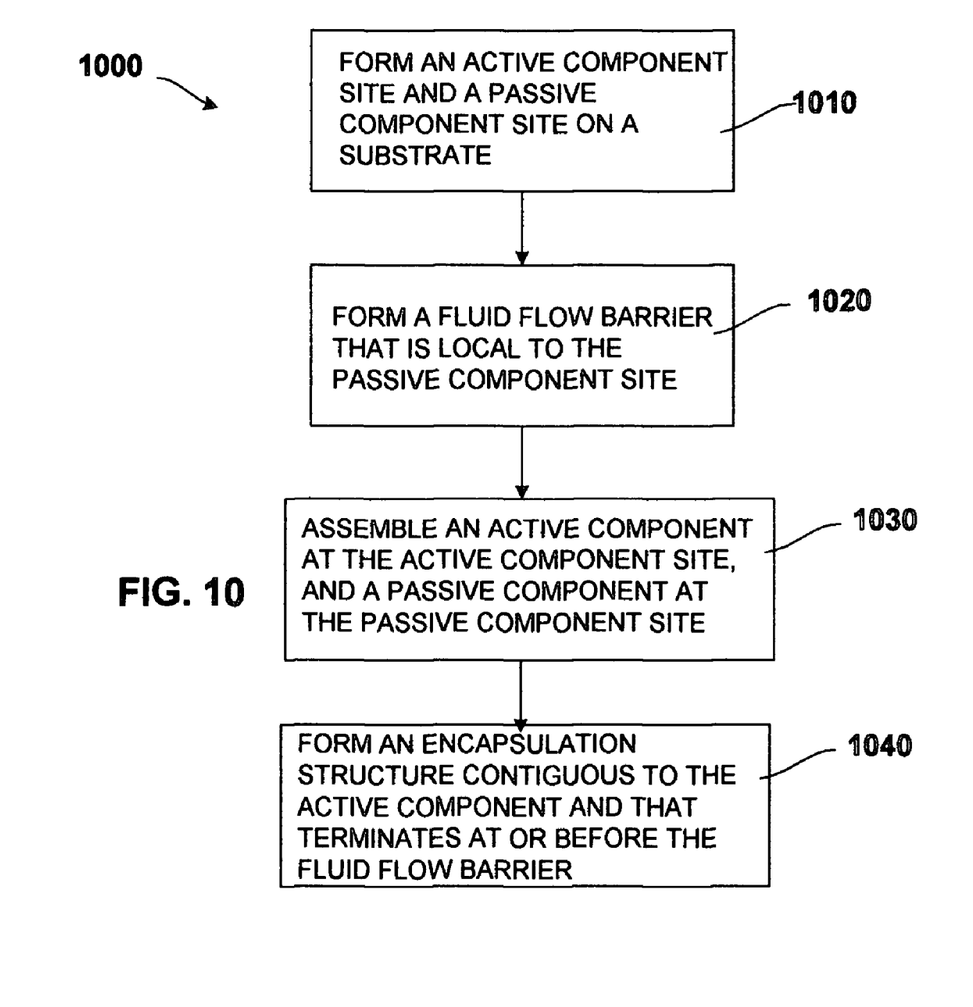
FIG. 10 is a process flow diagram that depicts a packaging process embodiment.

FIG. 10 is a method flow diagram that depicts a packaging method 1000 according to an embodiment. The method flow includes forming a mounting substrate. The method flow can also include assembling a chip package.

At 1010, the method includes forming an active component site and a passive component site in a substrate. In a non-limiting example, the method includes patterning an electrical layer 114 in a microstrip board 100 as depicted in FIG. 1.

At 1020, the method includes forming a fluid flow barrier that is local to the passive component site. In a non-limiting example, the method includes patterning the solder mask 112 that covers the electrical layer 114 as depicted in FIG. 1.

At 1030, the method includes assembling an active component at the active component site and a passive component at the passive component site. In a non-limiting example, the method includes assembling the passive component 128 and the active component 124 to the mounting substrate 110 with the recess 132 therebetween.

At 1040, the method includes underfilling the active component with underfill material, under conditions that cause the underfill material to stop at or before the fluid flow barrier that is local to the passive component site. In a non-limiting example, the method includes flowing encapsulation material under conditions that cause the underfill material to terminate at or before it encounters the local fluid flow barrier.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of various embodiments of this invention may be made without departing from the principles and scope thereof as expressed in the subjoined claims.

What is claimed is:

1. An article comprising:
   a mounting substrate;
   a passive component site on the mounting substrate;
   an active component site on the mounting substrate;
   a fluid flow barrier disposed local to the passive component site and spaced apart from the active component site, the fluid flow barrier comprising an unfilled recess; and
   an underfill material filling a space between the active component site and the mounting substrate, the underfill material stopping at or near an edge of the recess, the edge forming an obtuse angle directed against a flow of the fluid flow barrier.

2. The article of claim 1, the mounting substrate including a first side and a second side, wherein the passive component site and the active component site are disposed in a solder mask on the first side, and wherein the fluid flow barrier is integral with the solder mask.

3. The article of claim 1, wherein the fluid flow barrier includes a sidewall and a floor, wherein the floor includes an electrically conductive material.

4. The article of claim 1, the mounting substrate including a first side and a second side, wherein the passive component site and the active component site are disposed in a solder mask on the first side, wherein the fluid flow barrier is a trench in the solder mask, and wherein the trench describes a perimeter around the passive component site.

5. The article of claim 1, the mounting substrate including a first side and a second side, wherein the passive component site and the active component site are disposed in a solder mask on the first side, wherein the fluid flow barrier is a trench in the solder mask, wherein the trench describes a perimeter around the passive component site, wherein the perimeter includes a trench side that is adjacent and spaced apart from the active component site, and wherein the trench side that is adjacent and spaced apart from the active component site includes a non-linear boundary.

6. The article of claim 1, the mounting substrate including a first side and a second side, wherein the passive component site and the active component site are disposed in a solder mask on the first side, wherein the fluid flow barrier is a trench in the solder mask, wherein the trench describes a perimeter around the passive component site, wherein the perimeter includes a trench side that is adjacent and spaced apart from the active component site, wherein the trench side that is adjacent and spaced apart from the active component site includes a non-linear boundary, and wherein the non-linear boundary is selected from curvilinear, rectilinear, and combinations thereof.

7. The article of claim 1, wherein the passive component site is spaced apart a distance from the active component site in a range from about 5 mm to about 1 mm.

8. The article of claim 1, wherein the passive component site is spaced apart a distance from the active component site by about 1.7 mm.

9. The article of claim 1, further including at least one fluid flow barrier that is disposed general to the active component site.

10. The article of claim 1, wherein the at least one fluid flow barrier includes a trench with a dielectric floor.

11. The article of claim 1, wherein the passive component site is one of a plurality of passive component sites.

12. The article of claim 1, wherein the passive component site is one of a plurality of passive component sites, and wherein at least one fluid flow barrier of the plurality of passive component sites presents a non-linear boundary toward the active component site.

13. An article comprising:
a mounting substrate;
a first component site on the mounting substrate;
a second component site on the mounting substrate; and
a fluid flow barrier disposed local to the first component site and spaced apart from the second component site, the fluid flow barrier comprising an unfilled recess; and
an underfill material filling a space between the second component site and the mounting substrate, the underfill material stopping at or near an edge of the recess, the edge forming an obtuse angle directed against a flow of the fluid flow barrier.

14. The article of claim 13, the mounting substrate including a first side and a second side, wherein the first component site and the second component site are disposed in a solder mask on the first side, and wherein the fluid flow barrier is integral with the solder mask.

15. The article of claim 13, wherein the fluid flow barrier includes a sidewall and a floor, wherein the floor includes an electrically conductive material.

16. The article of claim 13, the mounting substrate including a first side and a second side, wherein the first component site and the second component site are disposed in a solder mask on the first side, wherein the fluid flow barrier is a trench in the solder mask, and wherein the trench describes a perimeter around the first component site.

17. The article of claim 13, the mounting substrate including a first side and a second side, wherein the first component site and the second component site are disposed in a solder mask on the first side, wherein the fluid flow barrier is a trench in the solder mask, wherein the trench describes a perimeter around the first component site, wherein the perimeter includes a trench side that is adjacent and spaced apart from the second component site, and wherein the trench side that is adjacent and spaced apart from the second component site includes a non-linear boundary.

18. The article of claim 13, the mounting substrate including a first side and a second side, wherein the first component site and the second component site are disposed in a solder mask on the first side, wherein the fluid flow barrier is a trench in the solder mask, wherein the trench describes a perimeter around the first component site, wherein the perimeter includes a trench side that is adjacent and spaced apart from the second component site, wherein the trench side that is adjacent and spaced apart from the second component site includes a non-linear boundary, and wherein the non-linear boundary is selected from curvilinear, rectilinear, and combinations thereof.

19. The article of claim 13, wherein the first component site is spaced apart a distance from the second component site in a range from about 5 mm to about 1 mm.

20. The article of claim 13, wherein the first component site is spaced apart a distance from the second component site by about 1.7 mm.

21. The article of claim 13, further including at least one fluid flow barrier that is disposed general to the second component site.

22. The article of claim 13, wherein the at least one fluid flow barrier includes a trench with a dielectric floor.

23. An article comprising:
a mounting substrate including a first side and a second side, wherein the first component site and the second component site are disposed in a solder mask on the first side;
a first component site on the mounting substrate;
a second component site on the mounting substrate, wherein the first component site and the second component site are disposed in a solder mask on the first side; and
a fluid flow barrier disposed local to the first component site and spaced apart from the second component site, and wherein the fluid flow barrier is integral with the solder mask, the fluid flow barrier comprising an unfilled recess; and
an underfill material filling a space between the second component site and the mounting substrate, the underfill material stopping at or near an edge of the recess, the edge forming an obtuse angle directed against a flow of the fluid flow barrier.

24. The article of claim 23, wherein the fluid flow barrier is a trench in the solder mask, wherein the trench describes a perimeter around the first component site, wherein the perimeter includes a trench side that is adjacent and spaced apart from the second component site, wherein the trench side that is adjacent and spaced apart from the second component site includes a non-linear boundary, and wherein the non-linear boundary is selected from curvilinear, rectilinear, and combinations thereof.

25. The article of claim 23, wherein the fluid flow barrier is a trench in the solder mask, wherein the trench describes a perimeter around the first component site, wherein the perimeter includes a trench side that is adjacent and spaced apart from the second component site, wherein the trench side that is adjacent and spaced apart from the second component site includes a non-linear boundary, and wherein the non-linear boundary is a composite of rectilinear segments and curvilinear segments.

26. The article of claim 23, wherein the fluid flow barrier is a trench in the solder mask, wherein the trench describes a perimeter around the first component site, wherein the perimeter includes a trench side that is adjacent and spaced apart from the second component site, wherein the trench side that is adjacent and spaced apart from the second component site includes an interior obtuse angle.

27. The article of claim 23, wherein the first component site is one of a plurality of first component sites.

28. The article of claim 23, wherein the first component site is one of a plurality of first component sites, and wherein at least one fluid flow barrier of the plurality of first component sites presents a non-linear boundary toward the second component site.

* * * * *